US008901972B2

(12) United States Patent
McQuilkin

(10) Patent No.: US 8,901,972 B2
(45) Date of Patent: Dec. 2, 2014

(54) PIN DRIVER CIRCUIT WITH IMPROVED SWING FIDELITY

(71) Applicant: Christopher C. McQuilkin, Hollis, NH (US)

(72) Inventor: Christopher C. McQuilkin, Hollis, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/736,740

(22) Filed: Jan. 8, 2013

(65) Prior Publication Data

US 2014/0191783 A1    Jul. 10, 2014

(51) Int. Cl.
*H03K 5/153*  (2006.01)
*H03K 3/00*   (2006.01)
*H03K 17/00*  (2006.01)

(52) U.S. Cl.
CPC ...................................... *H03K 17/00* (2013.01)
USPC ............. 327/112; 327/108; 327/84; 327/382; 327/587; 327/588; 326/83

(58) Field of Classification Search
USPC ................... 327/382, 84, 423, 494, 587, 588, 327/108–112, 427, 434; 326/82, 83, 86, 89
See application file for complete search history.

(56) References Cited

U.S. PATENT DOCUMENTS

| 5,699,001 | A | * | 12/1997 | Awaji et al. ................... 327/112 |
| 5,745,003 | A |   | 4/1998  | Wakimoto et al. |
| 6,498,473 | B1 | * | 12/2002 | Yamabe ................... 324/750.01 |
| 6,737,857 | B2 |   | 5/2004  | Babcock |
| 7,405,592 | B2 | * | 7/2008  | Ghobadian ..................... 326/82 |
| 2005/0030069 | A1 | * | 2/2005 | Isobe ............................ 327/112 |
| 2012/0007680 | A1 | * | 1/2012 | Hijikata et al. ............... 330/278 |

FOREIGN PATENT DOCUMENTS

WO    WO 2011111140 A1 *  9/2011

\* cited by examiner

*Primary Examiner* — Lincoln Donovan
*Assistant Examiner* — Thomas Skibinski
(74) *Attorney, Agent, or Firm* — Kenyon & Kenyon, LLP

(57) ABSTRACT

A circuit may include a controller, at least one bridge circuit, and a plurality of switches. The plurality of switches may be connected parallel to each other, each may have a switch output connected to the bridge circuit. The bridge circuit, upon receiving a current from the plurality of switches, may generate an output based on a reference voltage. The controller may generate a plurality of control signals, based on a voltage transition range, to selectively turn on the plurality of the switches in more than one combination, to supply a current to the output.

17 Claims, 3 Drawing Sheets

100

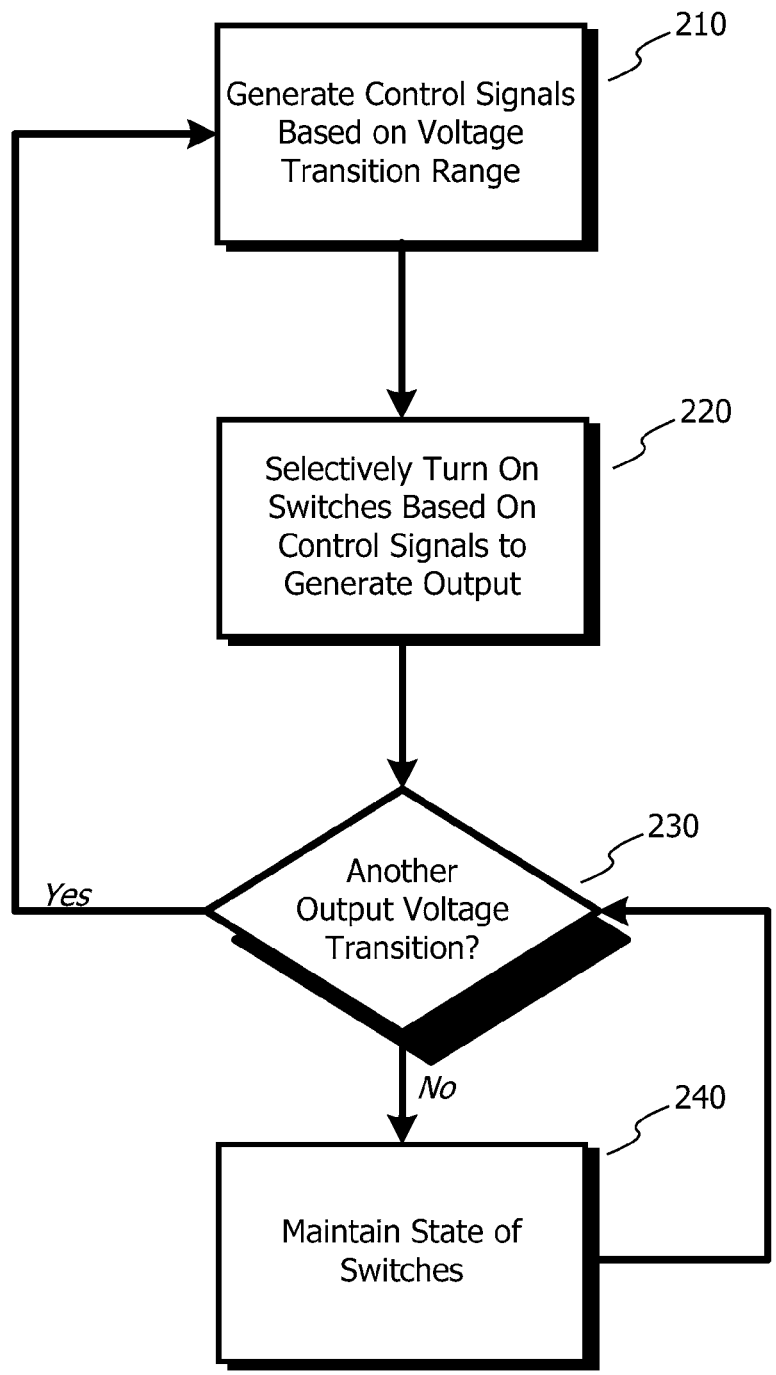

US 8,901,972 B2

PIN DRIVER CIRCUIT WITH IMPROVED SWING FIDELITY

BACKGROUND

In electronic device testing, a pin driver on a test system may provide a voltage pulse stimulus to a device under test (DUT) at a specific time and may measure a response from the DUT, to determine whether the DUT meets a range of parameters of its device specification. The quality of a test system may be determined by the waveform fidelity (ideality) and timing precision of the voltage pulse it provides. Spurious signals (switching transients) in the voltage pulses may be produced during voltage level transitions, and may impact both fidelity and timing accuracy.

An ideal voltage level transition may be defined as a linear voltage transition between two voltage levels. An actual voltage level transitioning may include deviations, such as overshoots, undershoots, pre-shoots, and slew nonlinearity, caused by spurious signals. These deviations negatively impact timing precision and need be minimized.

Spurious signals may be caused by parasitic capacitance in the voltage driver circuits of the test system. Dominant parasitic capacitance sources may include metal interconnect routing and device junction capacitances, which are both related to the physical switch/transistor size in the voltage driver circuits.

In order to test a variety of electronic devices, an automatic test system may need to drive a pin with voltage level transitions between different voltage extremes using different techniques. For example, memory devices may typically be tested using 'class A' techniques, which may require limited voltage swing ranges (swing of 25 mV to 500 mV for example) that also limits device power consumption in the memory devices. Other devices may be tested using 'class AB' techniques, which may require higher voltage transition speed and greater voltage swing ranges (>500 mV or >5V for example).

Some devices may have pins that need to be tested using both limited voltage swing ranges and greater voltage swing ranges, may thus require the test system, for example, to test the pins using both 'class A' techniques and 'class AB' techniques. This additional capability requirement poses a problem in test system design, that the test system need to be capable of driving large voltage swing ranges fast enough and driving small voltage swing ranges with high fidelity and few spurious signals.

Switch sizes of test systems may be designed based on the slew current requirements needed to meet the maximum transition speed requirement. In other words, in order to drive a pin with a relatively large voltage swing range in a small amount of time, the driver circuit may need to be able to produce relatively large amount of slew current, by having large switch size in the driver circuit.

Large switch size may correspond to large parasitic capacitance. The resultant spurious signals may be small, relative to the overall large voltage swing range. However, if the same driver circuit with large switch size is used to drive smaller voltage swing ranges, the same spurious signals may become relatively larger in proportion, and thus would significantly and negatively impact timing precision.

Thus, there is a need for an improved pin driver that can produce high swing fidelity when driving a variety of different voltage swing ranges.

BRIEF DESCRIPTION OF THE DRAWINGS

FIG. 2 illustrates an exemplary method according to an embodiment of the present disclosure.

DETAILED DESCRIPTION

Figure 1:
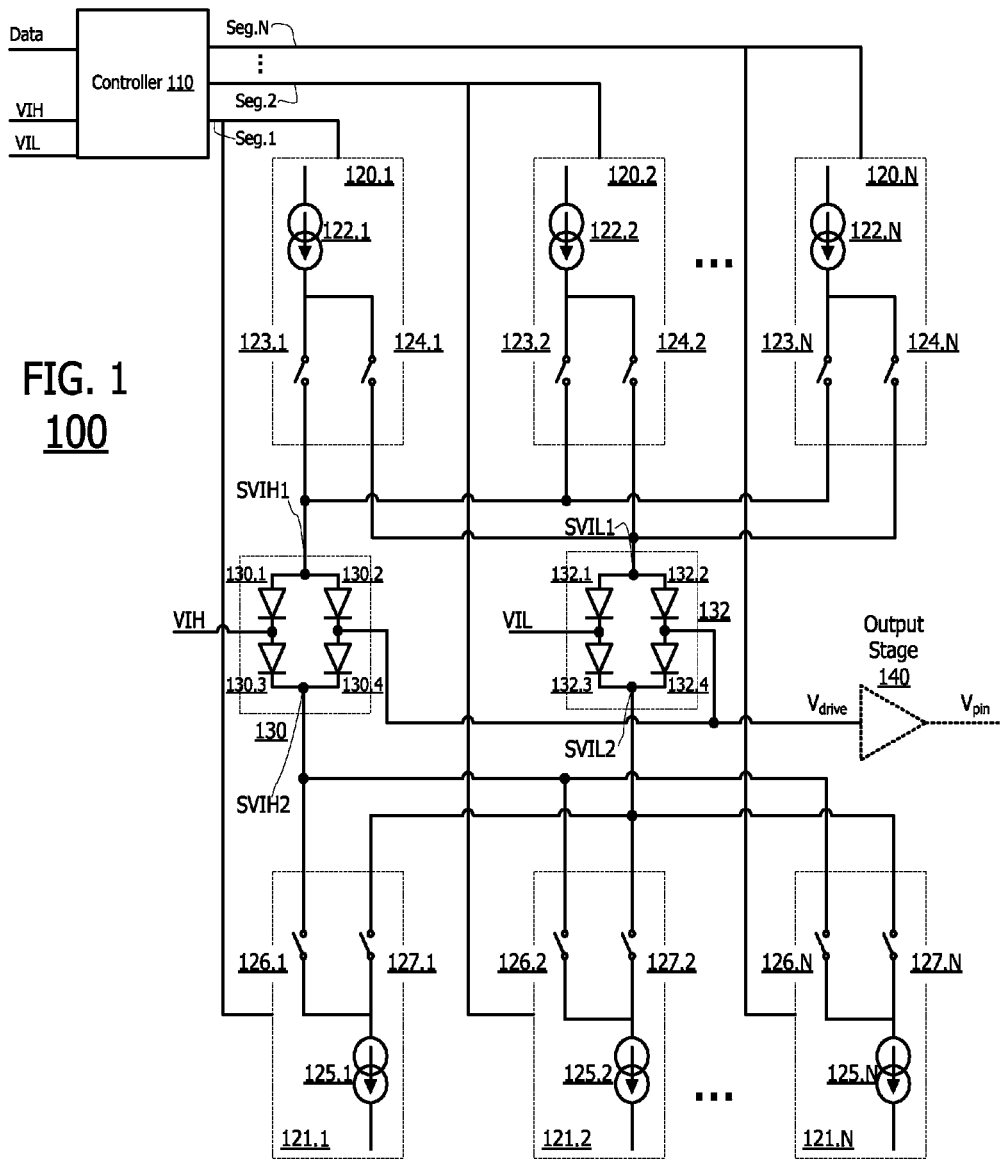
FIG. 1 illustrates an exemplary circuit according to an embodiment of the present disclosure.

FIG. 1 illustrates an exemplary circuit 100 according to an embodiment of the present disclosure.

The circuit 100 may include a controller 110, at least one bridge circuit (for example 130, 132), and a plurality of switches (for example 120.1-120.N, 121.1-121.N). The plurality of switches (120.1-120.N, 121.1-121.N) may be connected parallel to each other, each may have a switch output connected to the bridge circuit (130, 132) at SVIH1, SVIH2, SVIL1, SVIL2. The bridge circuit (130, 132), upon receiving a current from the plurality of switches (120.1-120.N, 121.1-121.N), may generate an output $V_{drive}$ based on a reference voltage (VIH, VIL). The controller 110 may generate a plurality of control signals (Seg.1-Seg.N), based on a voltage transition range (for example, VIH-VIL), to selectively turn on the plurality of the switches 120.1-120.N, 121.1-121.N) in more than one combinations, to supply a current to the output $V_{drive}$. Optionally, the circuit 100 may include an output stage 140 that drives a voltage $V_{pin}$, corresponding to $V_{drive}$.

The controller 110 may receive reference voltages (VIL, VIH) and a data signal DATA, to determine and generate the control signals (Seg.1-Seg.N), which may represent which segment of switches to turn on for one of the bridge circuits (130, 132). The control signals (Seg.1-Seg.N) may be binary coded. The controller 110 may include a processor executing a set of instructions stored on a non-transitory tangible computer readable medium, to perform a method according to the present disclosure.

Each of the plurality of the switches (120.1-120.N, 121.1-121.N) may receive a corresponding control signal (Seg.1-Seg.N), and turn on a respective current to a bridge circuit (130, or 132). Each of the plurality of the switches (120.1-120.N, 121.1-121.N) may include switching channels (123.1-123.N, 124.1-124.N, 126.1-126.N, and 127.1-127.N), with each switching channel connected to one of the bridge circuits (130, 132) at SVIH1, SVIH2, SVIL1, SVIL2. Each switch may include a current source (122.1-122.N, 125.1-125.N), which may limit the maximum supply current in each switch.

In FIG. 1, each segment of switches may be a pair of switches. For example, switches 120.1 and 121.1 may form one segment of switches, both being controlled by a control signal Sig.1. FIG. 1 illustrates by example, N segments of switches. However, more or less segments are possible depending on design requirements. Segments need not be in pairs, and need not be balanced or matched.

Each bridge circuit (130, 132) may represent a voltage clamping node which clamps the output to a corresponding reference voltage (respectively VIH, VIL). Each bridge circuit (130, 132) may be turned on, upon receiving a current from the outputs of the bridge circuits may be connected to each other to form a common output $V_{drive}$ in a wired-OR logic. During a voltage level transition on the common output, one of the bridge circuits may be turned off, and another bridge circuit may be turned on. Each bridge circuit (130, 132) may include a plurality of diodes (130.1-130.4, 132.1-132.4) to clamp the common output $V_{drive}$ to track the appropriate reference voltage (VIH, VIL). In other words, for example, if a current is supplied through the bridge circuit 130, flowing from SVIH1 to SVIH2, then voltages at SVIH1 and SVIH2 may be voltage clamped by VIH, and thus the common output $V_{drive}$ may be voltage clamped to track or transition toward VIH. If no current is supplied through the bridge circuit 130, flowing from SVIH1 to SVIH2, then the common output $V_{drive}$ may not be voltage clamped by the bridge circuit 130.

During a voltage level transition of the common output $V_{drive}$, for example, from VIL to VIH, the controller 110 may use control signals Sig.1-Sig.N, to turn off all of the switch channels (124.1-124.N and 127.1-127.N) for bridge circuit 132, and to turn on selective switch channels (some or all of 123.1-123.N and 126.1-126.N) for bridge circuit 130. Consequently, the current flowing from SVIL1 to SVIL2 may be turned off, the current may begin to flow from SVIH1 to SVIH2, and the common output $V_{drive}$ may be voltage clamped by the bridge circuit 130 and may be driven to transition to VIH.

In an embodiment, the switches (120.1-120.N, 121.1-121.N) may be selectively turned on in more than one combinations corresponding to more than one current levels supplied to the output. The more than one current levels may be evenly distributed, or may be arbitrarily set to specific predetermined current levels according to industry test standards or device specific parameters.

Each of the switches (120.1-120.N, 121.1-121.N), or the switch channel of each switch, may have a same physical size and a same parasitic capacitance on the switch output, or may have a different physical size and a different parasitic capacitance on the switch output. In one embodiment, the switch channel may have physical sizes that increase in size in multiples, for example, switch channel 123.2 may be twice the size of switch channel 123.1, and switch channel 123.N may be $2^{N-1}$ the size of switch channel 123.1. In such a case, the switch channel size would allow the controller 110 to use binary coded control signals Sig.1-Sig.N to produce current levels that are evenly distributed, with the minimum number of control signals.

In an embodiment, the switches (120.1-120.N, 121.1-121.N) may be selectively turned on in a timed sequence, to supply more than one current levels to the output in one single voltage transition period. That is, the controller 110 may selectively turn on only a few of the switches to supply a low current level at the early stage or the late stage of a voltage level transition period, to ensure that the low current level does not generate any significant spurious signals (large overshoot, undershoot, preshoot) near any voltage trip points, and selectively turn on more of the switches to supply a higher current level at the middle stage of a voltage level transition period to ensure a fast voltage level transition. This current ramp control sequence may allow the circuit to have additional control over output voltage swing fidelity.

FIG. 2 illustrates an exemplary method 200 according to an embodiment of the present disclosure.

The method 200 may include generating, based on a voltage transition range, a plurality of control signals (block 210), selectively turning on the plurality of the switches to generate an output voltage, based on the plurality of the control signals (block 220), determining if the output voltage is to be transitioned again (block 230). If the output voltage is to be transitioned, return to block 210, otherwise continue to maintain the state of the switches (block 240) and then return to block 230 to await for the next output voltage transition.

Figure 3A:
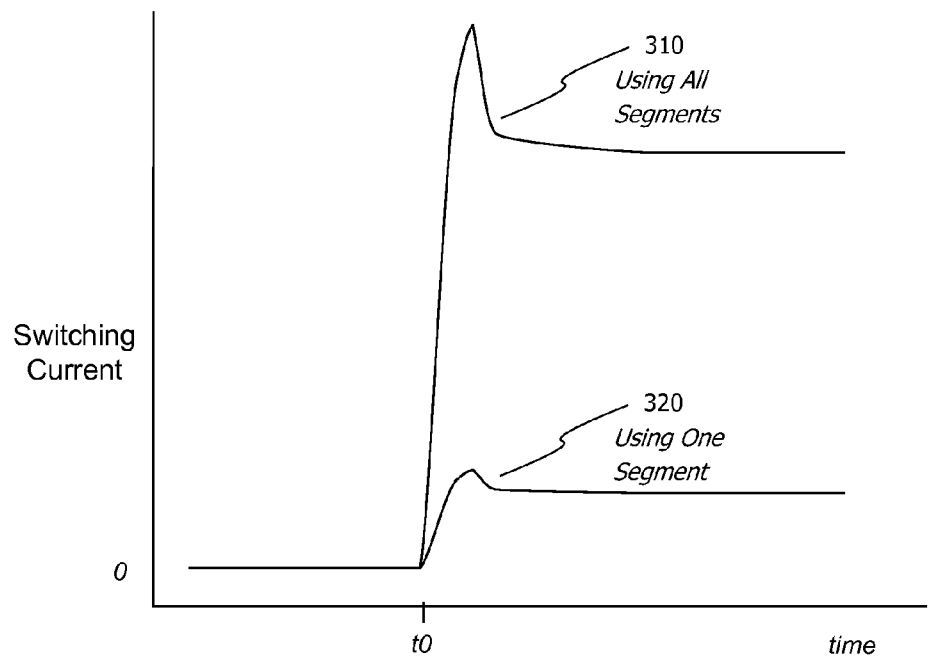
FIGS. 3a and 3b illustrate simulated switching current and voltage transition curves.
Figure 3B:
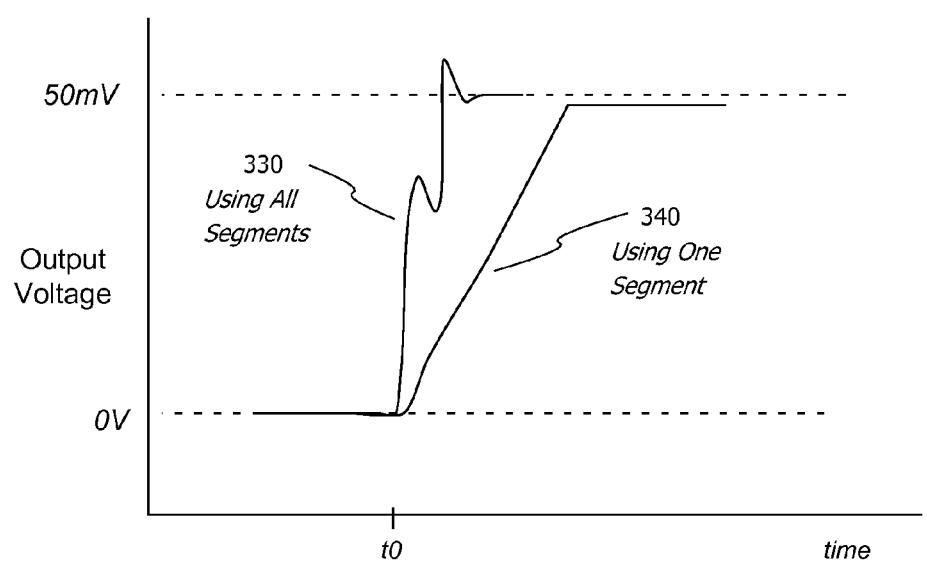

FIGS. 3a and 3b illustrate simulated switching current curves 310 and 320 and corresponding simulated voltage level transitions 330 and 340, to transition the output voltage between 0 mV and 50 mV, in an exemplary circuit.

For switching current curve 310, after time t0, all of the segments of switches may be turned on to supply current to the bridge circuit 130, the current may begin to increase. Correspondingly, the output voltage in voltage level transition 330 may begin to increase after t0. The current curve 310 may peak and overshoot, and then decrease to settle at some stable current level. Correspondingly, the voltage transition 330 may experience two disturbances.

In comparison, for switching current curve 320, after time t0, only one of the segments of switches may be turned on to supply current to the bridge circuit 130, the current may begin to increase. Correspondingly, the output voltage in voltage level transition 340 may begin to increase after t0. The current curve 320 may have much less of an overshoot, and then decrease to settle at some stable current level. Correspondingly, the voltage transition 340 may experience almost no disturbances, and thus may have improved voltage swing fidelity in an almost linear voltage level transition. However, voltage transition curve 340 may experience a longer voltage transition period.

As evident from FIGS. 3a and 3b, if the voltage level transition range is small (in this case, 50 mV), it may be necessary to use fewer segments of switches during voltage transitioning, to reduce parasitic capacitance, in order to reduce current and voltage disturbances, and to have better voltage swing fidelity. However, the use of fewer segments of switches may cause longer voltage transition period. Thus, design of the switch sizes and control signals may need to trade off between required maximum voltage transition period and voltage swing fidelity as necessary.

What is claimed is:

1. A transition driving circuit that selectively switches sources of current depending on information regarding a voltage transition to increase the linearity of voltage through the voltage transition, comprising:
   a first source of current coupled to a first switch and a second switch;
   a second source of current coupled to a third switch and a fourth switch;
   a first driver coupled to a high reference voltage, the first switch, the third switch, and an output to generate a high voltage at the output;
   a second driver coupled to a low reference voltage, the second switch, the fourth switch, and the output to generate a low voltage at the output; and
   a controller that is configured to receive voltage transition information and to selectively turn on and turn off the first switch, the second switch, the third switch, and the fourth switch to select an amount of current for the voltage transition depending on a magnitude of the voltage transition to reduce overshoots or undershoots in the voltage transition.

2. The circuit of claim 1, wherein the circuit is a pin driver circuit.

3. The circuit of claim 1, wherein the first driver and the second driver are diode bridges.

4. The circuit of claim 1, wherein the first source of current, the second source of current, the first switch, the second switch, the third switch, and the fourth switch are connected to a first side of the first driver and a first side of the second driver.

5. The circuit of claim 4, further comprising additional switches and additional sources of current connected to a second side of the first driver and a second side of the second driver.

6. The circuit of claim 1, further including an output stage coupled to the output.

7. The circuit of claim 1, wherein the controller receives the high reference voltage, the low reference voltage, and data as voltage transition information to generate control signals to control the first switch, the second switch, the third switch, and the fourth switch.

8. The circuit of claim 7, wherein the control signals are binary coded.

9. The circuit of claim 1, wherein the first switch, the second switch, the third switch, and the fourth switch are selectively turned on in more than one combinations corresponding to more than one current levels supplied to the output.

10. The circuit of claim 8, wherein the more than one current levels are evenly distributed.

11. The circuit of claim 1, wherein each of the first switch, the second switch, the third switch, and the fourth switch has a same physical size and a same parasitic capacitance on the switch output.

12. The circuit of claim 1, wherein each of the first switch, the second switch, the third switch, and the fourth switch has a different physical size and a different parasitic capacitance on the switch output.

13. The circuit of claim 1, wherein the first switch, the second switch, the third switch, and the fourth switch are selectively turned on in a sequence, to supply more than one current levels to the output in one voltage transition period.

14. A method of driving a voltage transition by selectively switching sources of current depending on information regarding the voltage transition to increase the linearity of voltage through the voltage transition, comprising:
  receiving voltage transition information at a controller;
  selecting, at the controller, an amount of current for the voltage transition depending on a magnitude of the voltage transition to reduce overshoots or undershoots in the voltage transition; and
  switching the sources of current on and off to output the amount of current for the voltage transition to a plurality of drivers.

15. The method of claim 14, wherein the plurality of drivers drive voltage at a pin.

16. The method of claim 14, wherein the plurality of drivers are diode bridges.

17. The method of claim 14, wherein the controller receives a high reference voltage, a low reference voltage, and data as voltage transition information to generate control signals to control a first switch, a second switch, a third switch, and a fourth switch.

\* \* \* \* \*